United States Patent
Chevalier et al.

(10) Patent No.: US 12,228,593 B2
(45) Date of Patent: Feb. 18, 2025

(54) CONTROL METHOD OF AN ELECTROTECHNICAL DEVICE

(71) Applicant: Schneider Electric Industries SAS, Rueil Malmaison (FR)

(72) Inventors: Marcel Chevalier, Grenoble (FR); Didier Van Dooren, Tullins (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 88 days.

(21) Appl. No.: 17/691,585

(22) Filed: Mar. 10, 2022

(65) Prior Publication Data

US 2022/0308097 A1   Sep. 29, 2022

(30) Foreign Application Priority Data

Mar. 25, 2021   (FR) ...................................... 2103011

(51) Int. Cl.
G01R 19/00 (2006.01)
G01K 13/00 (2021.01)
G01R 31/56 (2020.01)
G01R 31/66 (2020.01)

(52) U.S. Cl.
CPC ........... G01R 19/003 (2013.01); G01K 13/00 (2013.01); G01R 31/56 (2020.01); G01R 31/66 (2020.01)

(58) Field of Classification Search
CPC ........ G01K 13/00; G01R 31/66; G01R 31/56; G01R 9/003
See application file for complete search history.

(56) References Cited

U.S. PATENT DOCUMENTS

| | | | | |
|---|---|---|---|---|
| 5,510,687 A | * | 4/1996 | Ursworth | H02H 7/0833 |
| | | | | 318/806 |
| 9,772,364 B2 | * | 9/2017 | Lu | G01R 31/52 |
| 10,090,093 B2 | * | 10/2018 | Lu | H01F 38/28 |
| 10,539,601 B2 | * | 1/2020 | Lu | G01R 31/52 |
| 10,761,147 B2 | * | 9/2020 | Beaudet | G01R 31/40 |
| 10,784,677 B2 | * | 9/2020 | Porter | H02H 3/253 |
| 11,221,353 B2 | * | 1/2022 | Menzel | H02J 13/00002 |
| 11,733,273 B2 | * | 8/2023 | Menzel | G01R 19/003 |
| | | | | 713/300 |
| 2011/0050141 A1 | | 3/2011 | Yeh et al. | |
| 2017/0146586 A1 | | 5/2017 | Skjermo et al. | |
| 2018/0011133 A1 | | 1/2018 | Lu et al. | |

OTHER PUBLICATIONS

French Search Report and Written Opinion dated Dec. 23, 2021 for corresponding French Patent Application No. FR2103011, 9 pages.
Office Action for European Patent Application No. EP22157495.7, dated Aug. 28, 2024.

* cited by examiner

*Primary Examiner* — Daryl C Pope
(74) *Attorney, Agent, or Firm* — Troutman Pepper Locke LLP

(57) ABSTRACT

A method for monitoring an electrotechnical device, the electrotechnical device including three phases respectively connected to three phases of an electrical network and the method making it possible to determine an alert on the basis of a comparison between specific parameters associated with each of the phases and obtained from temperature and current measurements on each of the phases.

15 Claims, 5 Drawing Sheets

---

110 Measuring, for each phase, a plurality of temperature values within a determined time interval

↓

120 Measuring, for each phase, a plurality of current values within the determined time interval

↓

130 Determining, for each phase, a plurality of specific parameters, each specific parameter being determined based on a temperature value and on a current value of the corresponding phase, measured at corresponding times of the determined time interval

↓

140 Comparing all or some of the specific parameters of the plurality of specific parameters of the phases over the determined time interval

↓

150 Determining an alert on the basis of the comparison

CONTROL METHOD OF AN ELECTROTECHNICAL DEVICE

TECHNICAL FIELD

The invention belongs to the field of electrotechnical devices.

PRIOR ART

Many electrotechnical devices, due to the electricity that flows through them when they are connected to the electrical network, exhibit certain dangers both to hardware and to users.

Preventing these dangers is important, and in particular involves signalling adapted to users. One of the dangers concerns the connection state between various elements forming the current path in the devices. This connection state, if it is degraded, causes heating that may lead to risks of destroying nearby components, or even cause fires.

There are various signalling systems based on temperature measurement sensors that warn of a danger when a temperature limit is reached. These systems have the drawback of not taking into account the influence of ambient temperature and the level of current flowing through the connections, and of generating alerts needlessly.

The invention aims to improve this situation.

Presentation of the Invention

To this end, the invention proposes a method for monitoring an electrotechnical device, the electrotechnical device comprising three phases respectively connected to three phases of an electrical network, the monitoring method comprising the following steps:
- measuring, for each phase, a plurality of temperature values within a determined time interval,
- measuring, for each phase, a plurality of current values within the determined time interval,
- determining, for each phase, a plurality of specific parameters, each specific parameter being determined based on a temperature value and on a current value of the corresponding phase, measured at corresponding times of the determined time interval;
- comparing all or some of the specific parameters of the plurality of specific parameters of the phases over the determined time interval,
- determining an alert on the basis of the comparison.

The method according to the invention, by comparing specific parameters over a given time interval, makes it possible to provide an alert about causes of future dangers for the electrotechnical device, the electrical network and the user. In particular, these dangers may be prevented before they occur through an appropriate action. The method makes it possible for example to reduce risks of starting fires due to an incorrect connection between the network and the electrotechnical device.

Optionally, the current values are RMS current values and the specific parameters correspond to the temperature values divided by the squares of the RMS current values measured at the corresponding times of the determined time interval. In this option, the specific parameters use the temperature and the square of the RMS current values, such that the specific parameters are an image, or an equivalent, from the physical point of view, of the internal resistances of each phase. This makes it possible in particular to determine connection faults.

Optionally, the comparison comprises determining a regression function for the specific parameters for each of the phases over the determined time interval and comparing the regression functions. The regression function makes it possible to compare behaviours of each of the phases over the determined time interval in order to identify differences between each of the phases.

Optionally, comparing the regression functions comprises comparing respective gradients, the functions being linear functions. Comparing the respective gradients makes it possible to determine differences in the evolution of the specific parameters between each of the phases over the determined time interval.

Optionally, an alert is determined on the basis of the comparison when a difference between a first gradient of a regression function associated with a first phase and a second gradient of a regression function associated with a second phase is greater than a determined alert coefficient threshold. This makes it possible to determine an alert when the difference in the evolution of the specific parameters between two phases over the determined time interval is greater than a threshold value.

Optionally, a sum of the squares of the residuals is determined for each of the phases from their respective linear regression function. The sum of the squares of the residuals of the linear regression functions makes it possible in particular to determine whether a difference in values between the gradients of each of the linear regression functions is due to random variations in the specific parameters.

Optionally, the regression function for a phase is determined using a least squares method. This method makes it possible to determine a regression function that minimizes the deviations between the specific parameters of the determined time interval and their value estimated using the regression function.

Optionally, the determined alert comprises a notification indicating a possible connection fault between the electrotechnical device and the electrical network or within the electrotechnical device itself. This makes it possible for example to warn the user or an external department responsible for maintenance about a potential connection fault between the electrotechnical device and the electrical network.

Optionally, the alert comprises an identifier of a phase on which a possible connection fault has occurred. This makes it possible to target a phase subject to a potential connection fault.

Optionally, the alert comprises an alert message sent to a server, the alert message comprising an identifier of the electrotechnical device and at least one of an identifier of a phase of the electrotechnical device and an operating duration of the electrotechnical device. This allows for example a maintenance department to remotely evaluate the circumstances of a problem with the electrotechnical device or else to warn a security department of a company using the device in order to keep its employees and its hardware safe. This furthermore makes it possible to ensure that alerts are traceable, which alerts may in particular be used by insurance companies in the event of a fault with the electrotechnical device. This also allows the manufacturer, the user or even the maintenance operator of the electrotechnical devices to obtain statistical data according to the types of electrotechnical devices and received alerts.

The invention also relates to a method for processing alert messages by way of a server, the method comprising the server receiving a plurality of alert messages obtained using an appropriate method presented above, each alert message being associated with an electrotechnical device by an identifier and an operating duration, the processing method furthermore comprising at least one of the following steps:

identifying a type of device comprising a manufacturing defect based on the alert messages, and determining a fault function for a type of device based on the alert messages.

This allows for example a manufacturer, a user or even a maintenance operator of electrotechnical devices to identify types of device exhibiting manufacturing defects and to determine a fault function for a type of electrotechnical device based on the alert messages. The electrotechnical device manufacturer using the method for processing alert messages according to the invention will for example be capable of identifying a defective production chain or a component of a type of electrotechnical device that is fragile. With regard to the electrotechnical device user implementing the message processing method, he may for example guarantee the safety of his teams and his equipment or even identify recurring problems on certain types of device, which will make it possible in particular to guide his choices when acquiring other electrotechnical devices in the future. The maintenance operator using the message processing method may for example associate maintenance actions with various fault functions for a type of electrotechnical device.

Optionally, each alert message is also associated with a phase of the identified electrotechnical device, and the method comprises a step of identifying a manufacturing defect or connection fault with a phase of a type of device based on the alert messages. This makes it possible to identify a manufacturing defect or connection fault with a phase of a type of device.

The invention also relates to an electrotechnical system comprising an electrotechnical device comprising three phases respectively connected to three phases of an electrical network, the electrotechnical system also comprising at least three temperature sensors designed to measure a temperature on each of the phases, the electrotechnical system furthermore comprising a computer designed to control the electrotechnical system so as to implement any one of the monitoring methods presented in the present disclosure. The electrotechnical system advantageously comprises at least three current measurement means designed to measure a current on each of the phases.

The invention furthermore relates to a data processing device comprising a computer configured so as to implement one of the methods for processing alert messages described in the present document.

The invention relates lastly to a computer program product comprising instructions for implementing any one of the above methods when it is implemented by a computer.

BRIEF DESCRIPTION OF THE DRAWINGS

Other features, details and advantages will become apparent from reading the description provided below and from examining the appended drawing, in which.

DESCRIPTION OF THE EMBODIMENTS

Figure 1:
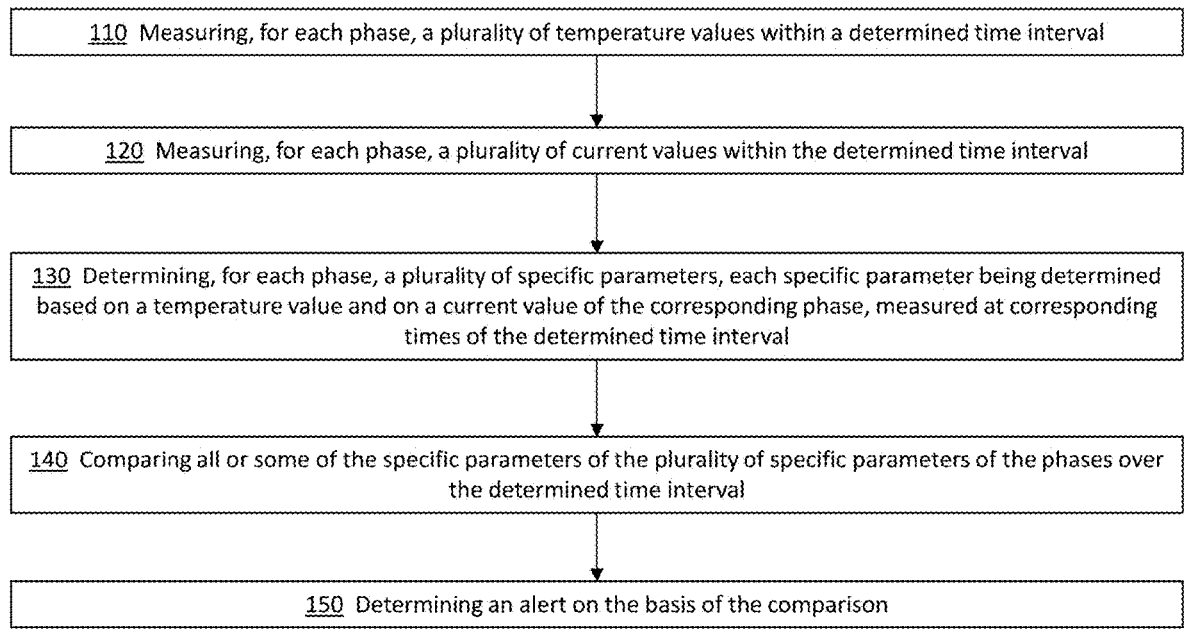
FIG. 1 shows one example of a method for monitoring an electrotechnical device.
Figure 2:
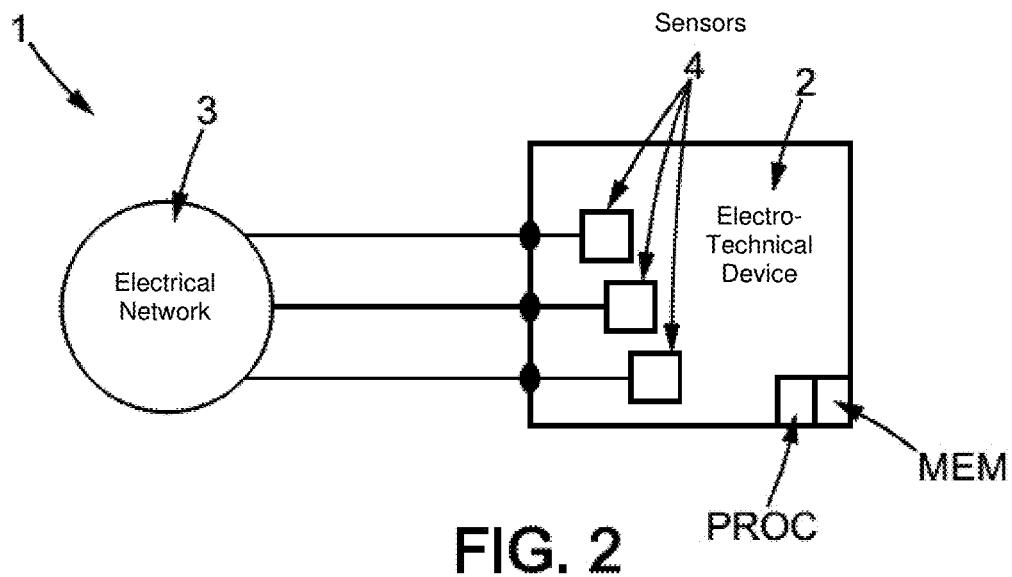
FIG. 2 shows one example of an electrotechnical system.

One example of an electrotechnical system is shown in FIG. 2. This exemplary electrotechnical system makes it possible in particular to implement one example of a method 100 for monitoring an electrotechnical device presented in FIG. 1.

The electrotechnical system 1 comprises an electrotechnical device 2. Electrical engineering is characterized by a set of techniques relating to practical applications for electrical, magnetic and electromagnetic phenomena. Therefore, an electrotechnical device in the sense of the invention may be a device that gives an electrical, magnetic or electromagnetic phenomenon a practical application. An electrotechnical device may for example correspond to a switching device such as a circuit breaker, a contactor or a switch. An electrotechnical device may also correspond to a transformer, to an alternator/motor or even to a machine tool.

The electrotechnical device 2 is connected to an electrical network, for example to a three-phase electrical network 3 as illustrated in FIG. 2. To this end, the electrotechnical device 2 comprises three phases, each being connected to a respective phase of the three-phase electrical network 3.

The electrotechnical system 1 comprises at least three temperature sensors 4 designed to measure temperature T values on each of the phases. The temperature sensors may for example be arranged inside the electrotechnical device 2, as shown in FIG. 1, or outside this electrotechnical device. A temperature sensor according to the invention may for example be a thermocouple sensor or a temperature probe.

The electrotechnical system 1 comprises current measurement means (not shown) for measuring current I values on each of the phases. The current measurement means may for example correspond to ammeters arranged on each of the phases. In particular, these current measurement means are designed to measure or estimate RMS current values $I_{rms}$ of the current (or "root mean square current") on each of the phases.

The electrotechnical system 1 may also comprise a computer PROC designed to execute code instructions, these possibly for example being contained in a memory MEM. The computer PROC is therefore connected to the memory MEM so that it is able to use information contained in the memory MEM. The memory MEM may for example comprise code instructions for executing one of the methods presented by the present application, such that the computer PROC is able to execute them. The computer PROC may for example comprise a processor, a controller or a microcontroller. It may for example be contained in the electrotechnical device 2, as illustrated by FIG. 1.

The memory MEM may for example comprise a ROM memory (Read-Only Memory), a RAM memory (Random Access Memory), an EEPROM memory (Electrically Erasable Programmable Read-Only Memory) or any other type of suitable storage means for reading code instructions. The memory MEM may for example comprise optical, electronic or even magnetic storage means.

The computer PROC is furthermore designed to receive data from the temperature sensors 4 and the current measurement means corresponding to temperature and current values on each of the phases. These temperature and current values may for example be stored in the memory MEM and/or sent to a server SERV.

As illustrated by block 110 in FIG. 1, the exemplary method 100 for monitoring an electrotechnical device may comprise measuring, for each phase, a plurality of temperature T values within a determined time interval. These measurements are performed by the temperature sensors, for example following a command sent by the computer PROC. Each temperature value is advantageously associated with a time at which it was measured over the determined time interval.

As illustrated by block 120, the method 100 may comprise measuring, for each phase, a plurality of current I values within the determined time interval. These measurements are performed by the current measurement means, for example following a command sent by the computer. In particular, the current value measurements may correspond to RMS current values of the electric current in each phase. Each current value is advantageously associated with a time at which it was measured over the determined time interval.

As stated above, the temperature and current values are for example stored in the memory MEM and/or on a server SERV. They may for example be sent to the server SERV by telecommunications channels such as 3G, 4G, wired, optical, electromagnetic, etc. channels.

The method may be implemented in real time such that, in some examples, the determined time interval may be a time interval that slides between the various executions of the method. In some examples, the time interval may be substantially the same between various executions of the method. In other examples, a size of the time interval may be modified between various executions of the method. In this sense, in some examples, the time interval may comprise a number of specific parameters P that may or may not vary between various executions of the method. The time interval may for example be greater than five minutes, but it may also be shorter. It may for example be of the order of one or several tens of minutes. The time interval is for example between 2 minutes and 180 minutes.

Temperature values and current values are for example measured at least every two minutes for each phase, and advantageously several times per minute. A longer measurement rate of the temperature and current values is also conceivable. A measurement rate for a current value and for a temperature value may for example be between one minute and twenty minutes for each of the phases.

Following blocks 110 and 120, the memory and/or the server therefore comprises measurements representing an evolution of the current I and of the temperature T in each phase over the determined time interval.

As illustrated by block 130, the method 100 may comprise determining, for each phase, a plurality of specific parameters P. Each specific parameter P is determined based on a temperature T value and on a current I value of the corresponding phase, measured at corresponding times of the determined time interval.

The plurality of specific parameters may for example comprise at least thirty specific parameters, each of the phases possibly for example being associated with ten specific parameters. The plurality of specific parameters may for example comprise between 24 and 300 specific parameters, and is advantageously greater than 6 specific parameters. In one example in which a temperature value and a current value are measured every two minutes for each phase and the plurality of specific parameters P comprises thirty specific parameters P, the determined time interval corresponds to around twenty minutes.

When the measured current values are RMS current values $I_{rms}$, the specific parameters may correspond to the temperature values divided by the squares of the RMS current values measured at the corresponding times of the determined time interval ($P=T/I_{rms}^2$). This formula is derived from the Joule effect formula reproduced below:

$$Q=R\int_{t1}^{t2} i^2 dt \quad \text{[Math. 1]}$$

in which Q corresponds to the energy dissipated in the form of heat between two times t1 and t2 by a resistive dipole R flowed through by a current of continuous strength i.

In the variant in which P corresponds to $T/I_{rms}^2$, the energy Q dissipated in the form of heat between two times is estimated using the temperature T value measured at a given time of the time interval on one phase by the temperature sensor, the current i being estimated using the RMS current $I_{rms}$ such that the specific parameter P is homologous with an internal resistance of the phase.

Figure 4:
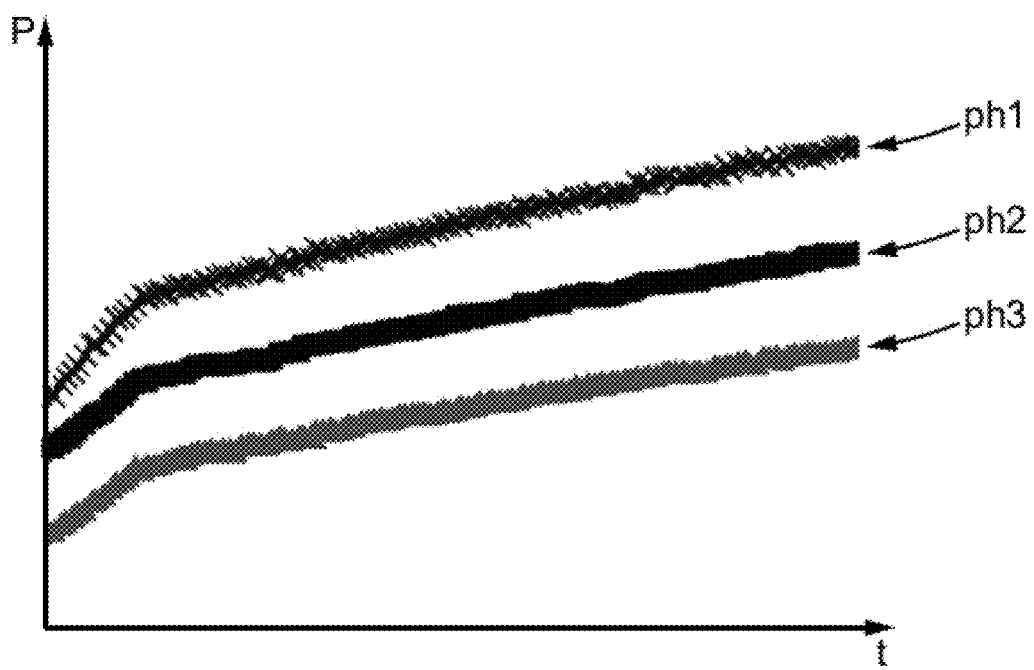
FIG. 4 shows one example of the evolution of specific parameters calculated for each of the phases over time.

One figure illustrating a representation of the specific parameters P obtained on the three phases in this variant is shown in FIG. 4. The abscissa axis represents time t and the ordinate axis represents the values of the specific parameters P. In FIG. 4, the first phase is referenced ph1, the second phase is referenced ph2 and the third phase is referenced ph3.

As illustrated by block 140, the method 100 may comprise comparing all or some of the specific parameters of the plurality of specific parameters of the phases over the determined time interval.

Comparing the specific parameters of the phases over the determined time interval may comprise identifying a different behaviour, that is to say a different evolution, of the specific parameters P between two phases or one phase with respect to the other two over the determined time interval. Thus, in FIG. 4, it may be seen that the first phase ph1 behaves slightly differently from the other two phases. Provided that each phase is supposed to behave similarly in normal operation, a difference in the evolution of the specific parameters P between various phases over one and the same time interval makes it possible to detect a problem with the electrotechnical system.

Thus, as illustrated by block 150, the method 100 may comprise determining an alert on the basis of the comparison of all or some of the specific parameters of the plurality of specific parameters of the phases over the determined time interval.

Identifying a different behaviour of the specific parameters P of two phases or of one phase with respect to the other two by comparing the specific parameters P may comprise determining a regression function for the specific parameters P for each of the phases over a determined time interval. In this case, the behaviours of the phases are compared in pairs, that is to say that, for example, the behaviour of the first phase is compared to the second phase or the behaviour of the second phase is compared to the third phase or else the behaviour of the third phase is compared to the first phase.

The method thereby makes it possible to determine an alert when it is observed that two phases are evolving differently over the determined time interval. Moreover, by comparing all of the pairs of phases, the method is capable of identifying a defective phase as being the phase whose evolution diverges from the other two over the determined time interval. In this scenario, the method also makes it possible to identify the origin of the fault.

The regression function for the specific parameters P of a phase makes it possible to mathematically model the evolution of the specific parameters P of this phase over the time interval under consideration, and therefore to be able to compare the phases with one another.

In particular, the regression functions modelling the evolution of the specific parameters P of each phase may be linear regression functions (hereinafter called first linear regression functions to differentiate them from the second linear regression functions that will be introduced in one variant embodiment). The first linear regression functions for the specific parameters P of each phase may thus be determined using a least squares method. The least squares method is intended to minimize the sum of the squares of the residuals. The residual may correspond to the vertical deviation (along the ordinate axis in FIG. 4) between a specific parameter P obtained from a temperature measurement and from a current measurement at a given time and its value estimated at the same time using the first linear regression function.

If the regression functions are first linear regression functions, identifying different behaviours of the specific parameters P between two phases or of one phase with respect to the other may comprise comparing the respective gradients. Specifically, comparing the gradients (i.e. slopes) of the first linear regression functions represents a comparison of the evolution of the parameters P over time over the determined time interval.

An alert is thus determined (block 150) on the basis of the comparison of all or some of the specific parameters P when an absolute value of a difference between a first gradient of a first linear regression function associated with a first phase and a second gradient of a first linear regression function associated with a second phase is greater than a determined alert coefficient threshold. The alert coefficient threshold may for example correspond to a percentage difference between the gradients. The differences between the alert coefficients should be understood in terms of absolute value here. Advantageously, the alert coefficient threshold is less than 10% and preferably less than 5%. The alert coefficient threshold may be chosen based on the number of specific parameters P determined in the time interval for each phase. The higher the number of specific parameters, the closer the alert coefficient threshold may be to 0%.

Moreover, it is possible to precisely identify a problematic phase when a difference between its gradient and the gradient of each of the other two phases is greater than the alert threshold, while a difference between the gradients of the other two phases is less than the alert threshold.

In one variant, rather than comparing the gradients of the first linear regression functions in order to compare the evolution of the specific parameters P of two phases, the method will compare the residuals obtained from the first linear regression functions for these two phases with residuals obtained from second linear regression functions, which are in particular obtained from the first linear regression functions for these two phases. The second linear regression functions may in particular be obtained from the gradients of the first linear regression functions.

In this case, this will involve determining, in the variant, whether a difference (SCEEDPT−SCEET) between a second total sum of the squares of the residuals (SCEEDPT) obtained from the second linear regression functions and a first total sum (SCEET) of the squares of the residuals obtained from the first linear regression functions is significantly greater than a difference due to random variations. If this is the case, we will be able to establish that the compared linear regression functions are not parallel, in which case the compared phases do not evolve in the same way. An alert may then be determined.

Thus, in this variant, it is possible to determine, for each of the compared phases, a first sum $SCEE_ph$ of the squares of the residuals (SCEE being used to denote the sum of the squares of the estimated deviations, the estimated deviations being the residuals), the residuals corresponding to the vertical deviations between the specific parameters P associated with a phase and their value estimated using the first linear regression function associated with this phase. This determination is shown in FIG. 5a, in which the first linear regression function associated with a first phase is shown at the top, while the first linear regression function associated with a second phase is shown at the bottom of the figure.

Figure 5A:
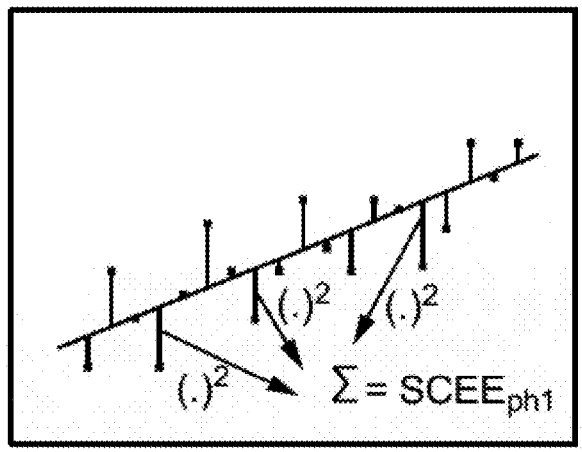
FIG. 5a shows, at the top, a first linear regression function associated with a first phase and, at the bottom, a first linear regression function associated with a second phase.
Figure 5A:
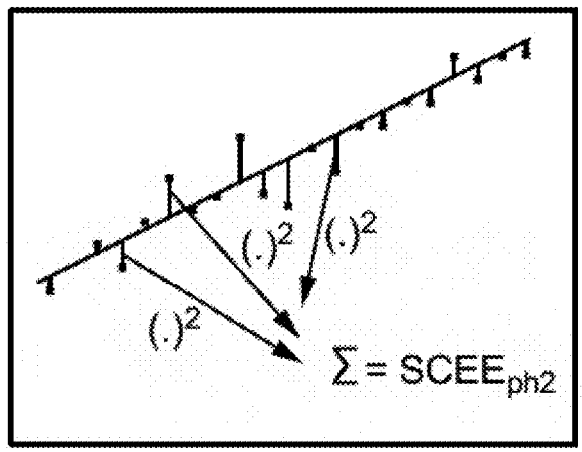

In other words, for the first phase, the first sum $SCEE_{ph1}$ of the squares of the residuals of the first phase is equal to the sum of the vertical deviations between the specific parameters P of the first phase and their value estimated using the first linear regression function at the corresponding times, as shown in FIG. 5a.

When the first regression functions have been calculated using the least squares method, the first sums $SCEE_{ph}$ of the squares of the residuals have already been calculated (since these first sums $SCEE_{ph}$ were minimized in order to find the first linear regression functions).

A first total sum SCEET of the squares of the residuals (SCEET being used to denote total sum of the squares of the estimated residuals) is thus calculated, this corresponding to an addition of the first sums $SCEE_{ph}$ of the squares of the residuals of the two compared phases. The first total sum SCEET of the squares of the residuals therefore corresponds, in the example illustrated in FIG. 5a, to the addition of the first sum $SCEE_{ph1}$ of the squares of the residuals of the first phase and of the first sum $SCEE_{ph2}$ of the squares of the residuals of the second phase.

An average gradient $CD_m$ of the two compared phases is also calculated from their respective first linear regression functions. The average gradient $CD_m$ corresponds to the sum of the respective gradient of the first regression functions for the two compared phases, divided by two.

At least one second linear regression function is then determined for each compared phase from the specific parameters P associated with this phase and the average gradient of the two compared phases. In particular, each of the gradients of the determined second linear regression functions is equal to the average gradient $CD_m$ of the first linear regression functions of the two compared phases. Only one parameter corresponding to the ordinate at the origin of the second linear regression functions is different between the second linear regression functions. The second linear regression functions are therefore all parallel with an average gradient and their parameter corresponding to the ordinate at the origin is determined from the specific parameters P of their phase.

A second sum SCEEDP of the squares of the residuals (SCEEDP being used to denote the sum of the squares of the estimated deviations of the parallel straight lines) is then determined for each second linear regression function, the residuals corresponding to the vertical deviations between the specific parameters P associated with the phase of the second linear regression function and their value estimated using this second linear regression function. A second sum SCEEDP of the squares of the residuals of a second linear regression function for a phase therefore corresponds to the sum of the squares of the vertical deviations between the specific parameters P of the phase and their value estimated using the second linear regression function. There are therefore as many second sums SCEEDP as there are second linear regression functions.

Figure 5B:
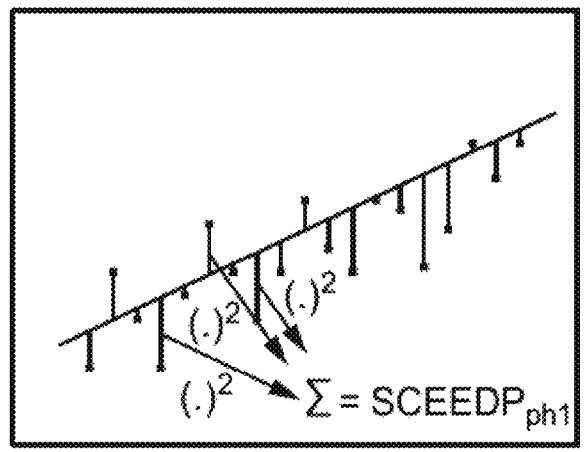
FIG. 5b shows, at the top, second linear regression functions associated with a first phase and, at the bottom, second linear regression functions associated with a second phase.
Figure 5B:
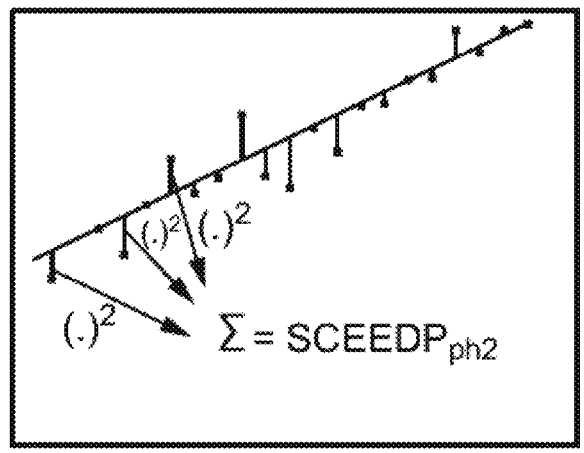

In this case, for each phase, it is possible to determine a second total sum SCEEDP$_{ph}$ of the squares of the residuals associated with a phase corresponding to the sum of the squares of the residuals of the second linear regression functions associated with the phase. This determination is shown in FIG. 5b, in which the second total sum SCEEDP$_{ph1}$ of the squares of the residuals associated with the first phase is illustrated at the top, while the second total sum SCEEDP$_{ph2}$ of the squares of the residuals associated with the second phase is illustrated at the bottom.

A second total sum SCEEDPT of the squares of the residuals is then calculated (SCEEDPT being used to denote the total sum of the squares of the estimated deviations of the parallel straight lines) corresponding to an addition (SCEEDPT=ΣSCEEDP) of the second sums SCEEDP of the squares of the residuals of the second linear regression functions. This second total sum SCEEDPT of the squares of the residuals also corresponds to an addition of the second total sums SCEEDP$_{ph}$ of the squares of the residuals associated with the compared phases (SCEEDPT=ΣSCEEDP$_{ph}$). In the illustrated example, the second total sum SCEEDPT of the squares of the residuals is therefore equal to the addition (SCEEDPT=SCEEDP$_{ph1}$+SCEEDP$_{ph2}$) of the second total sum SCEEDP$_{ph1}$ of the squares of the residuals associated with the first phase and of the second total sum SCEEDP$_{ph2}$ of the squares of the residuals associated with the second phase.

It is lastly determined whether the specific parameters P of the two compared phases have the same evolution over the time interval based on the first SCEET and the second SCEEDPT total sum of the squares of the residuals.

In particular, a residual error in the variation of the gradients Erv corresponding to the difference (SCEEDPT−SCEET) between the second total sum of the squares of the residuals (SCEEDPT) and the first total sum (SCEET) of the squares of the residuals is determined.

In one example, a Fisher statistic F is used, based on the residual error in the variation of the gradients Erv and the first total sum SCEET of the squares of the residuals. The Fisher statistic F may correspond to the following formula:

$$F = \frac{\frac{Erv}{k-1}}{\frac{SCEET}{n-2k}} \quad [\text{Math. 2}]$$

in which F corresponds to the Fisher statistic with k−1 and n−2k degrees of freedom,
Erv corresponds to the residual error in the variation of the gradients,
k corresponds to the number of second linear regression functions (k is therefore greater than or equal to 2),
SCEET corresponds to the first total sum of the squares of the residuals of the two compared phases, and
n corresponds to the number of specific parameters P of the two compared phases.

In this case, when F is greater than a determined rejection threshold, the evolutions of the compared phases are considered to be different, in which case an alert (block 150) is determined. The variation threshold may for example be less than 10% and advantageously less than 6% when F is expressed as a percentage. It is for example equal to 5% or to 1%.

In this case, by testing the three phases in pairs, it is possible to determine two phases exhibiting an evolution of their respective specific parameters P that are similar over the time interval, and another phase that differs from the other two. The method is therefore capable of identifying a phase that is not operating correctly. In one variant, if none of the phases react in the same way, the method is capable of identifying that there is an operating problem with the electrotechnical system, but it cannot identify the phases on which the problem is located. In particular, provided that only two phases evolve differently over the time interval, the method is capable of determining that there is an operating problem.

Returning to block 150 illustrated in FIG. 1, a determined alert may comprise a notification indicating a possible connection fault between the electrotechnical device and the electrical network. In this case, since the specific parameters P are dependent on the temperature and the current of the phase, they are linked to the internal resistance of the phases, which differ between the phases, in particular due to connection faults between the electrotechnical device and the electrical network. The alert may also comprise an acoustic or visual signal, for example intended for users close to the electrotechnical system in order to warn them about a potential fault.

A determined alert may also comprise an identifier of a phase on which a possible connection fault has occurred. As explained above, when the method is capable of determining which phase differs from the other two, the determined alert may also comprise an identifier of this phase. This will make it easier in particular to maintain the electrotechnical system.

The method for monitoring an electrotechnical device according to the invention therefore makes it possible to reduce both human and hardware risks linked to using an electrotechnical device connected to an electrical network. It makes it possible in particular to prevent starting fires linked to a connection fault between the phases of the electrotechnical device and the electrical network by detecting this fault before the fire.

In this case, the determined alert may also comprise an alert message sent to a server SERV. In this scenario, the alert message may comprise at least one of an identifier of a phase of the electrotechnical device and an operating duration of the electrotechnical device. The alert message may therefore be sent to a manufacturer, a security department, a maintenance operator, etc.

Figure 3:
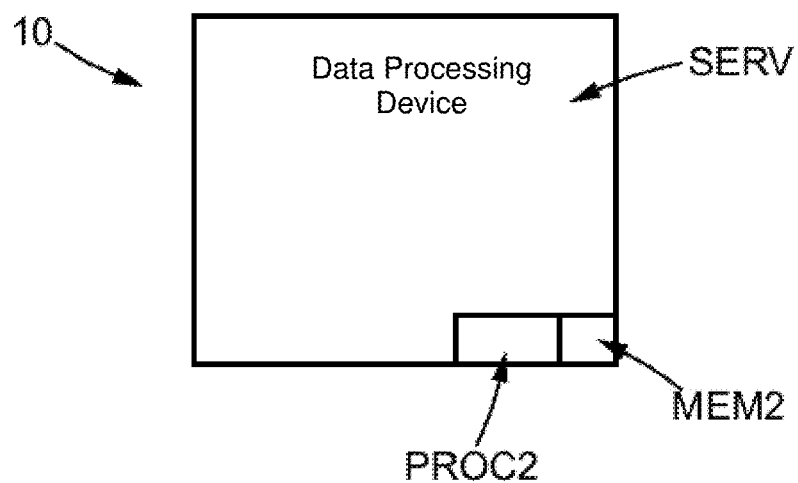
FIG. 3 shows one example of a data processing device.

The present disclosure also presents a data processing device 10 designed to process alert messages. This device 10 is shown in FIG. 3.

The device 10 may therefore comprise a server SERV designed to receive alert messages.

Each alert message is associated with an electrotechnical device by an identifier and an operating duration. Some alert messages may also comprise a phase of the identified electrotechnical device. The alert messages received by the server may therefore identify a plurality of electrotechnical devices 2 belonging to a plurality of electrotechnical systems 1. These alert messages may be stored in a memory MEM2 of the processing device 10. The memory MEM2 may comprise the same information storage means as the memory MEM presented with reference to FIG. 2.

The server SERV may also be designed to receive temperature values and current values associated with electrotechnical devices. These values may also be stored by the memory MEM2. In that case, the method presented with reference to FIG. 1 may be controlled in the server SERV, for example by a processor PROC2 similar to the processor PROC and connected to the memory MEM2.

The processor PROC2 is also designed to execute code instructions in order to control a method for processing alert messages on the server SERV.

The method for processing alert messages may comprise identifying a type of device comprising a manufacturing defect based on the alert messages. A type of electrotechnical device comprising a manufacturing defect is for example identified when a number of error messages for this type of device exceeds a predetermined manufacturing defect threshold.

In this case, if the alert messages comprise an identifier of the electrotechnical device, the processor is capable of identifying a type of electrotechnical device that regularly has alert messages. A type of electrotechnical device may for example correspond to or comprise a model of electrotechnical devices, a brand of electrotechnical devices or even a production line of electrotechnical devices.

The method for processing alert messages may also comprise determining a fault function for a type of electrotechnical device based on the alert messages. A fault function may for example be a statistical function for the occurrence of alerts for a type of electrotechnical device as a function of its number of operating hours. The statistical function for the occurrence of alerts may also comprise a fault in a phase when the alert messages comprise a phase identifier.

The method for processing alert messages may moreover comprise identifying a manufacturing defect or connection fault with a phase of a type of device. When the alert messages comprise a phase identifier, the method may identify a manufacturing defect or connection fault with a phase of a type of device. In this case, a manufacturing defect or connection fault with a phase of a type of device may be identified when a number of alert messages identifying one and the same phase of one and the same type of device is greater than a determined phase fault threshold.

Implementing the method for processing alert messages according to the invention therefore allows statistical processing of the alert messages. It allows in particular an interested person to identify manufacturing defects or connection faults with types of electrotechnical devices and, more precisely, certain phases of electrotechnical devices. It furthermore makes it possible to construct fault functions for types of electrotechnical devices over time, and in particular as a function of a number of operating hours.

The invention claimed is:

1. A method for monitoring an electrotechnical device, the electrotechnical device comprising three phases respectively connected to three phases of an electrical network, the method comprising:
    measuring, for each phase, a plurality of temperature values within a determined time interval,
    measuring, for each phase, a plurality of current values within the determined time interval,
    determining, for each phase, a plurality of specific parameters, each specific parameter being determined based on a temperature value and on a current value of the corresponding phase, measured at corresponding times of the determined time interval,
    comparing specific parameters of the phases over the determined time interval, the specific parameters including all or some of the plurality of specific parameters of the phases, wherein comparing the specific parameters includes comparing evolution of the specific parameters of one of the phases of the three phases with evolution of the specific parameters of at least one of the other phases of the three phases over the time interval, and
    determining an alert on the basis of the comparison.

2. The method according to claim 1, wherein the current values are RMS current values and the specific parameters correspond to the temperature values divided by the squares of the RMS current values measured at the corresponding times of the determined time interval.

3. The method according to claim 1, wherein the comparison comprises determining a regression function for the specific parameters for each of the phases over the determined time interval and comparing the regression functions.

4. The method according to claim 3, wherein comparing the regression functions comprises comparing respective gradients, the functions being linear functions.

5. The method according to claim 1, wherein an alert is determined on the basis of the comparison when a difference between a first gradient of a regression function associated with a first phase and a second gradient of a regression function associated with a second phase is greater than a determined alert coefficient threshold.

6. The method according to claim 4, wherein a sum of the squares of the residuals is determined for each of the phases based on their respective linear regression function.

7. The method according to claim 3, wherein the regression function for a phase is determined using a least squares method.

8. The method according to claim 1, wherein the determined alert comprises a notification indicating a possible connection fault between the electrotechnical device and the electrical network.

9. The method according to claim 8, wherein the alert comprises an identifier of a phase on which a possible connection fault has occurred.

10. The method according to claim 1, wherein the alert comprises an alert message sent to a server, the alert message comprising an identifier of the electrotechnical device and at least one of an identifier of a phase of the electrotechnical device and an operating duration of the electrotechnical device.

11. A method for processing alert messages by way of a server, the method for processing alert messages comprising the server receiving a plurality of alert messages obtained using the method according to claim 10, each alert message being associated with an electrotechnical device by an identifier and an operating duration, the method for processing alert messages further comprising at least one of:
    identifying a type of electrotechnical device comprising a manufacturing defect based on the alert messages, or
    determining a fault function for a type of electrotechnical device based on the alert messages.

12. The method for processing alert messages according to claim 11, wherein each alert message is further associated with a phase of the identified electrotechnical device, and wherein the method for processing alert messages comprises identifying a manufacturing defect or connection fault with a phase of a type of device based on the alert messages.

13. An electrotechnical system comprising an electrotechnical device comprising three phases respectively connected to three phases of an electrical network, the electrotechnical system further comprising at least three temperature sensors designed to measure a temperature on each of the phases, the electrotechnical system further comprising a computer designed to control the electrotechnical system according to the method of claim 1.

14. A processing device comprising a computer configured to implement the method according to claim 11.

15. A computer program product comprising a non-transitory computer-readable medium having instructions stored thereon for causing the method of claim 1 to be performed when the instructions are executed by a computer.

\* \* \* \* \*